United States Patent
Katz et al.

(10) Patent No.: US 11,239,402 B2
(45) Date of Patent: Feb. 1, 2022

(54) OPTOELECTRONIC SEMICONDUCTOR COMPONENT, AND METHOD FOR PRODUCING AN OPTOELECTRONIC SEMICONDUCTOR COMPONENT

(71) Applicant: OSRAM OLED GmbH, Regensburg (DE)

(72) Inventors: Simeon Katz, Regensburg (DE); Markus Maute, Alteglofsheim (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/964,533

(22) PCT Filed: Jan. 24, 2019

(86) PCT No.: PCT/EP2019/051772
§ 371 (c)(1),
(2) Date: Jul. 23, 2020

(87) PCT Pub. No.: WO2019/145435
PCT Pub. Date: Aug. 1, 2019

(65) Prior Publication Data
US 2021/0036200 A1 Feb. 4, 2021

(30) Foreign Application Priority Data
Jan. 26, 2018 (DE) .......................... 102018101815.0

(51) Int. Cl.
*H01L 33/62* (2010.01)
*H01L 23/00* (2006.01)
(Continued)

(52) U.S. Cl.
CPC .............. *H01L 33/62* (2013.01); *H01L 24/32* (2013.01); *H01L 24/83* (2013.01);
(Continued)

(58) Field of Classification Search
CPC ... H01L 33/62; H01L 31/02002; H01L 24/32; H01L 24/83
See application file for complete search history.

(56) References Cited

U.S. PATENT DOCUMENTS

| 10,629,780 B2 | 4/2020 | Baur et al. |
| 2011/0101537 A1 | 5/2011 | Barth et al. |
(Continued)

FOREIGN PATENT DOCUMENTS

| CN | 203674260 U | * | 6/2014 |
| CN | 203674260 U | | 6/2014 |
(Continued)

*Primary Examiner* — Marcos D. Pizarro
*Assistant Examiner* — Antonio B Grite
(74) *Attorney, Agent, or Firm* — Slater Matsil, LLP

(57) ABSTRACT

An optoelectronic semiconductor component and a method for producing an optoelectronic semiconductor component are disclosed. In an embodiment an optoelectronic semiconductor component includes a semiconductor body with a contact metallization located at a main surface of the semiconductor body, a protective layer partially covering the semiconductor body and the contact metallization, a substrate firmly bonded to the semiconductor body at the main surface, a recess and a terminal layer arranged within the recess, wherein the recess and the terminal layer extend from a side of the substrate facing away from the semiconductor body through the substrate and the protective layer up to the contact metallization, and wherein the terminal layer electrically contacts the contact metallization and a connection layer located between the substrate and the semiconductor body, the connection layer including a first region and a second region, wherein the first region is bonded together with the second region without using a bonding agent.

17 Claims, 2 Drawing Sheets

(51) Int. Cl.
*H01L 31/02* (2006.01)
*H01L 31/18* (2006.01)
*H01L 31/0216* (2014.01)
*H01L 33/44* (2010.01)
*H01L 33/48* (2010.01)
H01L 25/075 (2006.01)

(52) U.S. Cl.
CPC ........ *H01L 31/02002* (2013.01); *H01L 31/18* (2013.01); *H01L 31/0216* (2013.01); *H01L 33/44* (2013.01); *H01L 2224/32145* (2013.01); *H01L 2224/83896* (2013.01); *H01L 2933/0025* (2013.01); *H01L 2933/0066* (2013.01)

(56) References Cited

U.S. PATENT DOCUMENTS

| | | |
|---|---|---|
| 2011/0114989 A1 | 5/2011 | Suehiro et al. |
| 2012/0119246 A1 | 5/2012 | Yu et al. |
| 2014/0220716 A1 | 8/2014 | Steigerwald et al. |
| 2015/0255685 A1 | 9/2015 | Herrmann et al. |
| 2016/0141286 A1 | 5/2016 | Holz et al. |
| 2016/0218097 A1 | 7/2016 | Plössl et al. |

FOREIGN PATENT DOCUMENTS

| | | |
|---|---|---|
| DE | 102012217533 A1 | 3/2014 |
| DE | 102013105631 A1 | 12/2014 |
| DE | 102015120323 A1 | 5/2017 |
| EP | 2565945 A1 | 3/2013 |

\* cited by examiner

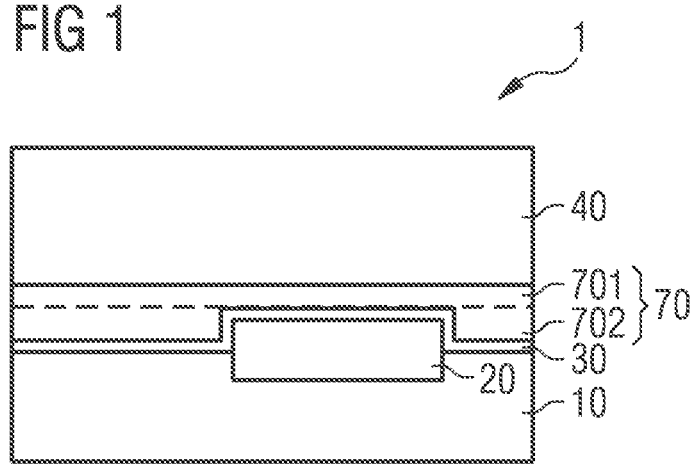
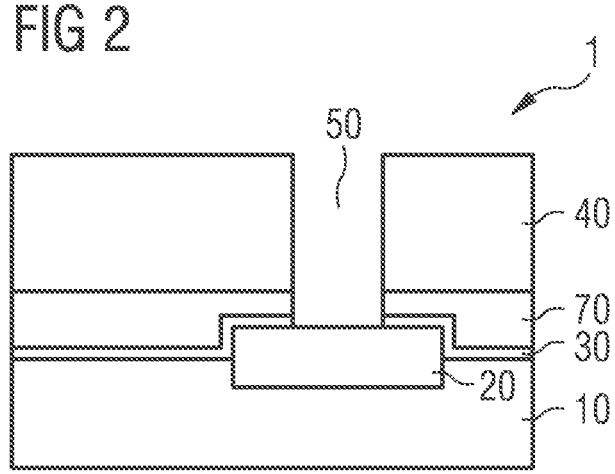

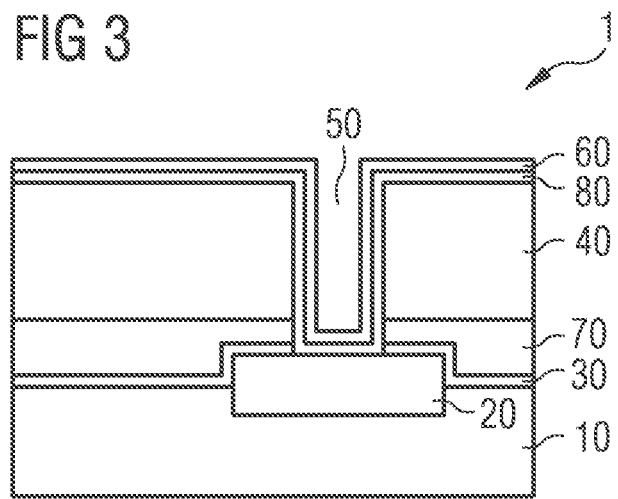
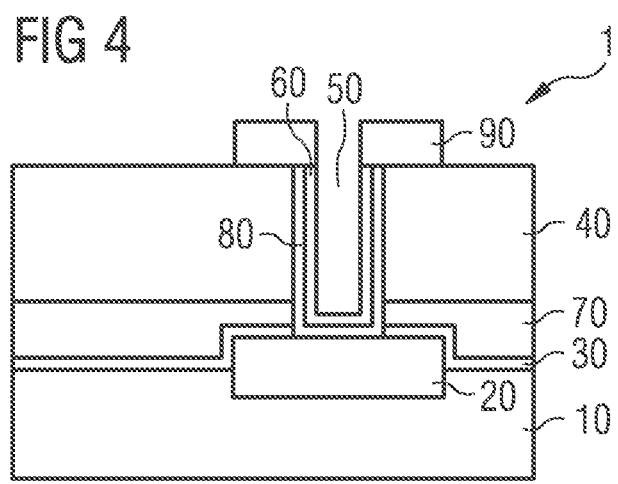

OPTOELECTRONIC SEMICONDUCTOR COMPONENT, AND METHOD FOR PRODUCING AN OPTOELECTRONIC SEMICONDUCTOR COMPONENT

This patent application is a national phase filing under section 371 of PCT/EP2019/051772, filed Jan. 24, 2019, which claims the priority of German patent application 102018101815.0, filed Jan. 26, 2018, each of which is incorporated herein by reference in its entirety.

TECHNICAL FIELD

An optoelectronic semiconductor component and a method for producing an optoelectronic semiconductor component are specified. The optoelectronic semiconductor component may in particular be a radiation-emitting or radiation-detecting optoelectronic semiconductor component which emits or detects electromagnetic radiation, for example light, during operation.

SUMMARY

Embodiments provide an optoelectronic semiconductor component which has an improved durability.

Further embodiments provide a method for producing an optoelectronic semiconductor component, which allows a simplified production.

According to at least one embodiment of the optoelectronic semiconductor component, the optoelectronic semiconductor component comprises a semiconductor body with a contact metallization arranged on a major surface of the semiconductor body and a protective layer partially covering the semiconductor body and the contact metallization.

The contact metallization is formed in particular with a metal and forms an ohmic contact with the semiconductor body and is provided for the electrical contacting of the semiconductor body.

Preferably, the semiconductor body comprises a plurality of epitaxially grown semiconductor layers and may have an active layer with a pn junction for emission or detection of electromagnetic radiation.

In particular, the protective layer has good adhesion to the contact metallization and serves, for example, as an etch stop layer during production.

According to at least one embodiment of the optoelectronic semiconductor component, the optoelectronic semiconductor component comprises a substrate which is attached to the semiconductor body on the side of one main surface in a firmly bonded manner. The substrate serves in particular for the mechanical stabilization of the optoelectronic semiconductor component.

According to at least one embodiment of the optoelectronic semiconductor component, the optoelectronic semiconductor component comprises a recess and a terminal layer arranged within the recess, the recess and the terminal layer extending from a side of the substrate facing away from the semiconductor body through the substrate and the protective layer up to the contact metallization. The terminal layer forms an electrically conductive contact with the contact metallization and serves for the electrical connection of the optoelectronic semiconductor component. The recess can have an advantageously large aspect ratio, for example an aspect ratio of at least 1:3, preferably of at least 1:10 and particularly preferably of at least 1:20. The aspect ratio describes the ratio of the diameter to the depth of a recess. A large aspect ratio enables an advantageously large density of recesses and thus in particular an increased density of light-emitting diodes (LEDs) that can be controlled electrically isolated from each other.

According to at least one embodiment of the optoelectronic semiconductor component, the optoelectronic semiconductor component comprises a semiconductor body with a contact metallization arranged on a major surface of the semiconductor body, a protective layer that partially covers the semiconductor body and the contact metallization, a substrate firmly bonded to the semiconductor body from the main surface, a recess and a terminal layer arranged within the recess, wherein the recess and the terminal layer extend from a side of the substrate facing away from the semiconductor body through the substrate and the protective layer to the contact metallization, and wherein the terminal layer electrically contacts the contact metallization.

One of the considerations underlying an optoelectronic semiconductor component described here is that a through-hole for the electrical contacting of the individual light-emitting diodes is necessary for the production of a pixelated LED on silicon. For this purpose, deep recesses are made in the substrate, for example by means of an etching process. A high pixel density usually requires a correspondingly high density of through-holes with a sufficiently large aspect ratio. This places great demands on the mastery of the etching process and the selectivity of the etchants used.

The optoelectronic semiconductor component described here makes use, among other things, of the idea of increasing the selectivity of the etching process by means of an etch stop layer of, for example, $Al_2O_3$. This simplifies the production process and the necessary control of the etching process is advantageously reduced. Oxidation of the contact metallization can be avoided by using a precious metal or a precious metal alloy as material for the contact metallization. Furthermore, the reliability of the optoelectronic semiconductor component is increased by avoiding oxide formation on the contact metallization.

According to at least one embodiment of the optoelectronic semiconductor component, a connection layer, preferably formed with $SiO_2$, is formed between the substrate and the semiconductor body. The connection layer may in particular contain $SiO_2$ or consist of $SiO_2$. The connection layer is particularly suitable for a direct bonding process in which two layers with smoothly polished surfaces are bonded together without the use of a further bonding agent. $SiO_2$ is also easy and inexpensive to apply and is well suited for forming a smooth polished surface.

According to at least one embodiment of the optoelectronic semiconductor component, the substrate is formed with silicon. The substrate can contain silicon in particular or consist of silicon. Silicon is available in the form of wafers in large quantities at low prices and provides a good mechanical basis for the optoelectronic semiconductor component.

According to at least one embodiment of the optoelectronic semiconductor component, the protective layer is formed with a nitride or an oxide, preferably with TaN, $Ta_2O_5$, TiN, $TiO_2$, $Si_3N_4$, $Si_2ON_2$, SiO, $SiO_2$, AlN or $Al_2O_3$. In the case of $Si_2ON_2$ not only a stoichiometric silicon oxynitride is meant, but also any non-stoichimetrically deposited mixed form of a silicon oxynitride. TaN, $Ta_2O_5$, TiN, $TiO_2$, $Si_3N_4$, $Si_2ON_2$, SiO, $SiO_2$, AlN or $Al_2O_3$ in particular exhibit sufficient adhesion to precious metals such as platinum or gold and can be removed advantageously easily by wet chemical means.

According to at least one embodiment of the optoelectronic semiconductor component, the protective layer is formed by means of an ALD process (ALD: Atomic Layer Deposition). An ALD process is a deposition process by which a monolayer of atoms is deposited. This means that the atomic layers are not stacked on top of each other, but only a monatomic layer is deposited on a surface. The advantage of such a monolayer deposition is a very good coverage of all unevennesses of the surface and the coverage of even the smallest particles and unevennesses. This results in a very dense layer, which can advantageously serve as a very good etch stop layer.

According to at least one embodiment of the optoelectronic semiconductor component, the contact metallization contains or consists of a precious metal or a precious metal alloy. A precious metal or a precious metal alloy advantageously does not form an oxide layer on contact with air or more aggressive media. Thus, especially after an etching process and the exposure of the contact metallization, the formation of an oxide layer on the contact metallization and a resulting deterioration of the contact behavior are advantageously reduced or prevented.

According to at least one embodiment of the optoelectronic semiconductor component, the terminal layer is formed with tungsten and/or copper. In particular, the terminal layer can contain tungsten and/or copper or consist of tungsten and/or copper. With these materials a conformal deposition, for example, by means of an ALD deposition process and/or a CVD (chemical vapor deposition) process for high aspect ratios is advantageously possible. Tungsten and copper offer sufficiently high conductivity to carry a typical current of an LED. Furthermore, tungsten and copper are well suited for subsequent planarization and polishing processes, in particular chemical mechanical polishing (CMP), i.e., a chemically assisted mechanical polishing process. Alternatively, a metal-ALD layer can be applied. This means that a metal layer deposited by ALD can also serve as a terminal layer.

According to at least one embodiment of the optoelectronic semiconductor component, an adhesive layer is formed between the terminal layer and an inner wall of the recess. An adhesive layer reduces the risk of the terminal layer becoming detached and can also reduce or prevent diffusion between the terminal layer and the layers surrounding the terminal layer.

According to at least one embodiment of the optoelectronic semiconductor component, the adhesive layer is formed with titanium nitride or tantalum nitride. In particular, the adhesive layer can contain titanium nitride or tantalum nitride or consist of titanium nitride or tantalum nitride. Titanium nitride or tantalum nitride show an advantageously uniform deposition with high aspect ratios. For the formation of the adhesive layer the above mentioned processes are again suitable.

According to at least one embodiment of the optoelectronic semiconductor component, a nickel or gold layer is arranged on the terminal layer in the area of the recess. This serves to increase the current capability of the terminal layer in the recess. In particular, it is also possible to fill the recess partially or completely with the material of the terminal layer and/or nickel or gold (partial fill galvanic).

According to at least one embodiment of the method for producing an optoelectronic semiconductor component, the process comprises the following steps:

A) In the first step, a substrate on which a first region of a connection layer is arranged is provided. The first region of the connection layer is formed with a dielectric such as $SiO_2$, for example. Further, a semiconductor body is provided with a protective layer, a contact metallization arranged between the protective layer and the semiconductor body, which preferably has an ohmic contact to the semiconductor body, and with a second region of a connection layer arranged on the side of the protective layer facing away from the semiconductor body. Preferably the protective layer completely covers the contact metallization and/or the second region of the connection layer. The semiconductor body is in particular epitaxially grown and may have an active layer with a pn junction for emission or detection of electromagnetic radiation. The protective layer is applied in particular by means of an ALD process and serves as an etch stop layer. The contact metallization is formed in particular with a precious metal or a precious metal alloy, so that no oxide layer is formed on contact with air. The second region of the connection layer is, for example, formed with the same material as the first region of the connection layer and is used for simple mechanical bonding with both regions of the connection layer.

B) In the next step, the first region of the connection layer with a side facing away from the substrate is connected to the side of the second region of the connection layer facing away from the semiconductor body. This step includes in particular a direct bonding process in which two layers are bonded together without any further bonding agent.

C) In the next step, a recess is formed from a side of the substrate facing away from the semiconductor body, which completely penetrates the substrate, the connection layer and the protective layer. For example, the recess is formed by an etching process.

D) In the next step, a terminal layer is introduced in the recess to create an electrically conductive connection between the terminal layer and the contact metallization. The terminal layer is used for the electrical contacting of the optoelectronic semiconductor component and is formed in particular with a metal that can be deposited well with a CVD process or an ALD process.

According to at least one embodiment of the method for producing an optoelectronic semiconductor component, step C) is carried out by means of an etching process comprising the steps of etching through a substrate by means of a first etchant, etching through the connection layer by means of a second etchant, and etching through the protective layer by means of a third etchant, wherein the protective layer is stable with respect to the second etchant and wherein the contact metallization is stable with respect to the third etchant. A high selectivity of the etchants ensures an advantageously uniform etching and thus allows the production of large aspect ratios. If a material is stable against an etchant, it will be attacked less or not at all by the etchant.

According to at least one embodiment of the method for producing an optoelectronic semiconductor component, the second region of the connection layer on the side facing away from the semiconductor body is planarized between step A) and step B). A planarization process can be realized by means of a CMP process, for example. This produces a smooth surface that is particularly suitable for a direct bonding process.

According to at least one embodiment of the method for producing an optoelectronic semiconductor component, step B) is carried out by means of direct bonding. In this process, an additional connecting means can advantageously be dispensed with.

According to at least one embodiment of the method for producing of an optoelectronic semiconductor component, step D) is carried out at temperatures up to a maximum of 400° C., preferably up to a maximum of 300° C. and particularly preferably up to a maximum of 250° C. Avoiding high temperatures is advantageous for protecting the optoelectronic semiconductor component.

BRIEF DESCRIPTION OF THE DRAWINGS

Advantageous designs, further embodiments and advantages of the optoelectronic semiconductor component result from the following exemplary embodiments, which are shown in connection with the figures.

FIGS. 1 to 4 show schematic cross-sections through an optoelectronic semiconductor component at different steps of a method for its production according to a first exemplary embodiment.

DETAILED DESCRIPTION OF ILLUSTRATIVE EMBODIMENTS

Identical, similar or similar-acting elements are marked with the same reference signs in the figures. The figures and the proportions of the elements represented in the figures to each other are not to be considered as true to scale. Rather, individual elements may be oversized for better representability and/or comprehensibility.

FIG. 1 shows a schematic cross-section of an optoelectronic semiconductor component 1 in a first step of a method for its production. In the first step a silicon substrate 40 is provided. The substrate 40 has a first region 701 of a connection layer 70 on one of its major surfaces. The first region 701 of the connection layer 70 consists of a $SiO_2$ and can be grown on the substrate 40, in particular by thermal oxidation.

A contact metallization 20 is applied to a semiconductor body 10. The contact metallization 20 and the semiconductor body 10 are completely covered by a protective layer 30. The contact metallization 20 has an ohmic contact to the semiconductor body 10 and is formed with platinum. The protective layer 30 is applied to the semiconductor body 10 and the contact metallization 20 by means of an ALD process. This makes the protective layer 30 a very dense layer. A second region 702 of the connection layer 70 is applied to the protective layer 30. The dotted line in FIG. 1 indicates the boundary between the first region 701 of the connection layer 70 and the second region 702 of the connection layer 70. The first region 701 of the connection layer 70 is firmly bonded to the second region 702 of the connection layer 70, for example by direct bonding.

FIG. 2 shows a schematic cross-section of an optoelectronic semiconductor component 1 in a further step of a method for its production and is essentially similar to FIG. 1. In a further step, a recess 50 is introduced into the optoelectronic semiconductor component 1. The recess 50 extends from the side of the substrate 40 facing away from the semiconductor body 10 to the contact metallization 20 and penetrates the protective layer 30, the connection layer 70 and the substrate 40 completely. The recess 50 is produced in particular by an etching process, wherein a first etchant is used for etching through the substrate 40, which does not attack or only slightly attacks the material of the connection layer 70, a second etchant is used for etching through the connection layer 70, which does not attack or only slightly attacks the protective layer 30, and a third etchant is used for etching through the protective layer 30, which does not attack or only slightly attacks the contact metallization 20. By means of this process it is possible to produce a recess 50 with a large aspect ratio and to expose the contact metallization 20 without oxidizing its surface.

FIG. 3 shows a schematic cross-section of an optoelectronic semiconductor component 1 in a further step of a method for its production and is essentially similar to FIG. 2. An adhesive layer 80 and a terminal layer 60 are applied within the recess 50. The terminal layer 60 is formed in particular with tungsten. The adhesive layer 80 is formed with a titanium nitride. Both the adhesive layer 80 and the terminal layer 60 are applied into the recess 50 and onto the substrate 40 by means of a CVD process. The CVD process is particularly suitable for this purpose, as it enables conformal deposition even with large aspect ratios. The adhesive layer 80 is mainly used to prevent separation of the terminal layer 60 from the side walls of the recess 50. Alternatively, it is also possible to dispense with the adhesive layer 80, since the adhesion of the terminal layer 60 alone is already sufficiently high when tungsten is used. Likewise, the use of a metal ALD layer as terminal layer 60 is a possible variant.

FIG. 4 shows a schematic cross-section of an optoelectronic semiconductor component 1 in a further step of a method for its production and is essentially similar to FIG. 3. The side of the substrate 40 facing away from the semiconductor body 10 is freed from the adhesive layer 80 and the terminal layer 60 by means of a CMP process. On the side of the substrate 40 facing away from the semiconductor body 10, a terminal pad 90 is arranged in the region of the recess 50. The terminal pad 90 forms an electrically conductive path to the semiconductor body 10 via the terminal layer 60 and the contact metallization 20. This serves, for example, for further electrical contacting of the optoelectronic semiconductor component 1 during its later assembly.

The invention is not limited by the description based on the exemplary embodiments. Rather, the invention comprises each new feature as well as each combination of features, which in particular includes each combination of features in the claims, even if this feature or combination itself is not explicitly stated in the claims or exemplary embodiments.

The invention claimed is:

1. An optoelectronic semiconductor component comprising:
    a semiconductor body with a contact metallization located at a main surface of the semiconductor body;
    a protective layer partially covering the semiconductor body and the contact metallization;
    a substrate firmly bonded to the semiconductor body at the main surface,
    a recess and a terminal layer arranged within the recess,
    wherein the recess and the terminal layer extend from a side of the substrate facing away from the semiconductor body through the substrate and the protective layer up to the contact metallization, and
    wherein the terminal layer electrically contacts the contact metallization; and
    a connection layer located between the substrate and the semiconductor body, the connection layer comprising a first region and a second region,
    wherein the first region is bonded together with the second region without using a bonding agent.

2. The optoelectronic semiconductor component according to claim 1, wherein the connection layer comprises $SiO_2$.

3. The optoelectronic semiconductor component according to claim 1, wherein the substrate comprises silicon.

4. The optoelectronic semiconductor component according to claim 1, wherein the protective layer comprises nitride or oxide.

5. The optoelectronic semiconductor component according to claim 1, wherein the protective layer comprises TaN, $Ta_2O_5$, TiN, $TiO_2$, $Si_3N_4$, $Si_2ON_2$, SiO, $SiO_2$, AlN or $Al_2O_3$.

6. The optoelectronic semiconductor component according to claim 1, wherein the protective layer is formed by an ALD process.

7. The optoelectronic semiconductor component according to claim 1, wherein the contact metallization contains a precious metal or a precious metal alloy.

8. The optoelectronic semiconductor component according to claim 1, wherein the terminal layer comprises tungsten and/or copper.

9. The optoelectronic semiconductor component according to claim 1, wherein a nickel- or gold- layer is arranged on the terminal layer in a region of the recess.

10. The optoelectronic semiconductor component according to claim 1, wherein an adhesive layer is formed between the terminal layer and an inner wall of the recess.

11. The optoelectronic semiconductor component according to claim 10, wherein the adhesive layer comprises TiN or TaN.

12. A method for producing an optoelectronic semiconductor component, the method comprising:
providing a substrate on which a first region of a connection layer is arranged, a semiconductor body, a protective layer, a contact metallization arranged between the protective layer and the semiconductor body and a second region of the connection layer, which is arranged on a side of the protective layer remote from the semiconductor body;
connecting the first region of the connection layer to the second region of the connection layer;
forming a recess from a side of the substrate facing away from the semiconductor body, which completely penetrates the substrate, the connection layer and the protective layer; and
forming a terminal layer into the recess to create an electrically conductive connection between the terminal layer and the contact metallization.

13. The method according to claim 12, wherein forming the recess comprises:
etching through the substrate by a first etchant;
etching the connection layer by a second etchant; and
etching through the protective layer by a third etchant,
wherein the protective layer is stable with respect to the second etchant, and
wherein the contact metallization is stable with respect to the third etchant.

14. The method according to claim 12, wherein the second region of the connection layer is planarized on the side remote from the semiconductor body after providing the connection layer and before connecting the first region of the connection layer to the second region of the connection layer.

15. The method according to claim 12, wherein connecting the first region of the connection layer to the second region of the connection layer comprising connecting by direct bonding.

16. The method according to claim 12, wherein forming the terminal layer comprises forming the terminal layer at temperatures up to at most 400° C.

17. The method according to claim 12, wherein forming the terminal layer comprises forming the terminal layer at temperatures up to at most 250° C.

* * * * *